(12) United States Patent
Jones

(10) Patent No.: US 6,459,269 B1
(45) Date of Patent: Oct. 1, 2002

(54) CAPACITANCE REJECTING GROUND FAULT PROTECTING APPARATUS AND METHOD

(75) Inventor: Thaddeus M. Jones, Bremen, IN (US)

(73) Assignee: MSX, Inc., South Bend, IN (US)

( * ) Notice: Subject to any disclaimer, the term of this patent is extended or adjusted under 35 U.S.C. 154(b) by 0 days.

(21) Appl. No.: 09/824,431

(22) Filed: Apr. 2, 2001

(51) Int. Cl.$^7$ .................. G01R 31/14; G01R 31/08; G01R 25/00; H02H 9/08; G01N 37/00
(52) U.S. Cl. .................. 324/509; 324/522; 324/525; 702/65; 702/59; 702/58; 361/42; 361/47; 361/82
(58) Field of Search .................. 324/522, 509, 324/525; 361/47, 42, 82; 702/65, 59, 58

(56) References Cited

U.S. PATENT DOCUMENTS

| | | | | |
|---|---|---|---|---|
| 4,107,778 A | * | 8/1978 | Nii et al. ................. | 364/492 |
| 4,559,491 A | * | 12/1985 | Saha ..................... | 324/52 |
| 4,803,635 A | * | 2/1989 | Andow ................... | 364/483 |
| 4,809,123 A | * | 2/1989 | Alkington et al. ......... | 361/42 |
| 4,815,002 A | * | 3/1989 | Verbanets ................ | 364/484 |
| 5,117,323 A | * | 5/1992 | Asplund .................. | 361/47 |
| 5,455,776 A | * | 10/1995 | Novosel .................. | 364/492 |
| 5,514,964 A | * | 5/1996 | Benesh et al. ............ | 324/509 |
| 5,773,980 A | * | 6/1998 | Yang ..................... | 324/525 |
| 5,783,946 A | * | 7/1998 | Yang ..................... | 324/522 |
| 6,154,036 A | * | 11/2000 | Baldwin .................. | 324/509 |
| 6,219,591 B1 | * | 4/2001 | Vu et al. ................ | 700/286 |
| 6,249,230 B1 | * | 6/2001 | Baldwin .................. | 340/650 |
| 6,370,483 B1 | * | 4/2002 | Beckwith ................. | 702/65 |

FOREIGN PATENT DOCUMENTS

| | | | | | |
|---|---|---|---|---|---|
| JP | 402136025 A | * | 5/1990 | ............ | H02H/3/38 |
| JP | 407200084 A | * | 8/1995 | ............ | G05F/1/70 |

* cited by examiner

Primary Examiner—N. Le
Assistant Examiner—Wasseem H. Hamdan
(74) Attorney, Agent, or Firm—Taylor & Aust P.C.

(57) ABSTRACT

An apparatus and a method of controlling a load in response to a ground fault condition includes measuring a ground fault alternating current flowing from the load. A real part and an imaginary part of the ground fault alternating current is ascertained. Electrical power is removed from the load and/or the ground fault condition is indicated to a user if a magnitude of the real part exceeds a first predetermined threshold and/or a magnitude of the imaginary part exceeds a second predetermined threshold.

16 Claims, 6 Drawing Sheets

Fig. 6a
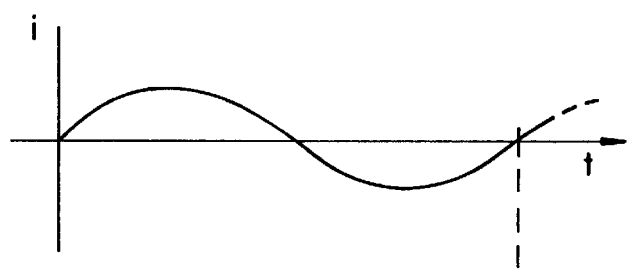
Fig. 6b
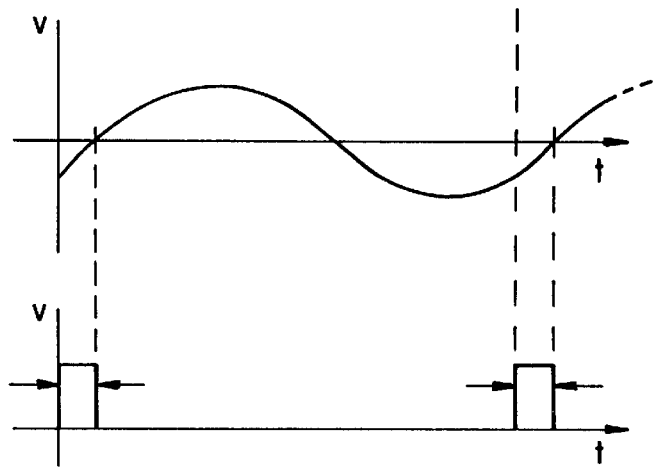
Fig. 6c

CAPACITANCE REJECTING GROUND FAULT PROTECTING APPARATUS AND METHOD

BACKGROUND OF THE INVENTION

1. Field of the Invention

The present invention relates to a ground fault protection apparatus and method, and, more particularly, to a ground fault protection apparatus and method for preventing shock and/or equipment damage.

2. Description of the Related Art

The U.S. National Electrical Code (NEC) requires ground fault protection for both shock and equipment protection. Although shock protection requires a 6-milliampere limit, there is no NEC current limit for equipment protection. In the U.S., a figure of 30 milliamperes is commonly used and 100 milliamperes in Canada.

The are two types of ground fault protection apparatus. A ground fault circuit interrupter (GFCI) opens its branch circuit upon detecting a ground fault current exceeding a maximum limit. Current cannot be restored to the branch circuit until the GFCI is manually reset. GFCI applications include residential kitchens, outdoor applications, and bathroom branch circuits, including those for floor warming and heating. In residential applications, the GFCI limit is 6 milliamperes for personnel protection and 30 milliamperes for heating apparatus and equipment protection.

The second type of ground fault protection apparatus warns of a ground fault hazard but does not interrupt current flowing in a branch circuit. Warning is used only in fire protection applications where the ground current hazard is considered less dangerous than interrupting the current to pipe trace heaters that keep wet sprinkler systems from freezing.

The ground fault current is the vector sum of the currents flowing in a branch circuit. If there is no ground fault current flowing, the branch currents sum to zero. In the event of a ground fault current, the branch currents do not sum to zero. Their difference is the ground fault current.

FIG. 1 shows a balanced electrical branch circuit 10 with no ground fault current flowing. Circuit 10 includes input wiring 12 and a two-pole circuit breaker 14 providing over-current protection and circuit interruption. Two-pole circuit breaker 14 is required in electrical systems without a grounded neutral including low voltage (i.e., less than or equal to 600 volts AC) branch circuits using U.S. common distribution voltages. These include 240 volts single and three-phase along with 208 and 480 volts three-phase. U.S. distribution voltages with a grounded neutral include 120 volts single phase along with 277 volts three-phase.

A current $i_1$ flows to a load 16 through a ground fault protector 18. Similarly, a current $i_2$ flows from the load 16 through ground fault protector 18. In FIG. 1, no ground current flows. Thus, the sum of the currents $i_1$ and $i_2$ is zero.

FIG. 2 shows the case with a ground fault current $i_3$ flowing from a load 20. FIG. 2 is identical to FIG. 1 except that the ground current $i_3$ flows to equipment ground. A branch circuit 22 must supply the ground fault current $i_3$. Thus, the ground fault current $i_3$ equals the difference between $i_1$ and $i_2$.

The ground fault current $i_3$, expressed as a vector, has both magnitude and phase. This is caused by the fact that there is capacitance between the current-carrying branch circuit 22 and ground. The reactive, imaginary current component 24 (FIG. 3) flowing through the capacitance is at a right angle to the in-phase, resistive, real component 26. Since capacitance is purely reactive, current flowing through it does not cause heating. Further, such capacitance is not indicative of a shock hazard. Thus, capacitance does not indicate a threat to either personnel or equipment. The resistive component, in contrast, does cause heat and is indicative of a threat to both personnel and equipment. So far as fire safety is concerned, only the real current causes heating. The imaginary component does not.

In a typical cable configuration heater 28 as is shown in FIG. 4, a heater wire 30 is surrounded by insulating material 32. Failure of the heater's insulation 32 causes a substantial in-phase ground fault current to flow. A shield 34 provides fire safety by diverting current resulting from insulation or mechanical failure to the shield 34 which is connected to the safety ground (i.e., earth ground). Shield 34 conducts this current to safety ground, thus providing protection until the GFCI or ground fault protector 18 detects a ground fault current above a threshold value and interrupts current flow in the branch circuit 22. Thus, the fire hazard is eliminated.

Heating cable 28 can be used for pipe trace heating, floor warming and heating, ceiling and wall heating along with many industrial applications for process heating. Although cable heaters employ a wide variety of construction schemes and insulating material, they all employ a grounded outer braided shield 34 or stainless steel or copper jacket as required by the NEC. This construction eliminates the fire hazard that would otherwise occur if insulation 32 failed for any of a variety of reasons.

FIG. 5 shows the equivalent lumped circuit of the heater and the elements causing the flow of the ground fault current $i_3$. A substantial capacitance 36 between the heating element 30 and equipment ground (i.e., safety ground) exists that is proportional to the heater length. The application of supply voltage to the heating element 30 causes a substantial current to flow through this capacitance 36 to equipment ground. This represents a ground fault current $i_3$.

A leakage resistance 38 and heater-to-shield capacitance 36 are shown as acting at the center of the cable heater 28. This simplification is reasonable since the leakage resistance 38 and leakage reactance 36 are much greater than the heater resistances 40 and 42. The leakage currents $i_4$ and $i_5$ flow into the equipment ground 44 (i.e., safety ground).

The vector sum of the currents $i_4$ and $i_5$ equal $i_3$ which is the ground fault current. From FIG. 5, it is shown that the ground fault current $i_3$ has two components: $i_4$ which is real and $i_5$ which is imaginary. The real component $i_4$ is in phase with the branch distribution voltage across input wiring 12. The imaginary component $i_5$ leads the real component $i_4$ by ninety degrees. FIG. 3 shows the vector relationship between these currents when expressed as phasors.

The commonly used 30-milliampere GFCI setting for equipment protection does not eliminate the shock hazard. In heating applications, the 30-milliampere limit creates both economic and safety problems. The 30-milliampere GFCI setting limits the length of heater cable that can be powered by a single branch circuit—particularly at the higher distribution voltages of 277 and 480 volts (600 volts in Canada). The capacitance 36 between the shield 34 and the heater wire 30 is proportional to length, as is the ground fault current. The 30-milliampere setting is too high to provide shock protection.

What is needed in the art is a method of identifying the real and imaginary parts of a ground fault current.

SUMMARY OF THE INVENTION

The present invention provides a method for providing both shock and equipment protection in a single GFCI or ground fault protection device by rejecting or ignoring all or most of the ground fault current that is due to capacitance between the heaters and distribution bus wiring and ground.

The invention comprises, in one form thereof, a method of controlling a load in response to a ground fault condition. The method includes measuring a ground fault alternating current flowing from the load. A real part and an imaginary part of the ground fault alternating current is ascertained. Electrical power is removed from the load and/or the ground fault condition is indicated to a user if a magnitude of the real part exceeds a first predetermined threshold and/or a magnitude of the imaginary part exceeds a second predetermined threshold.

An advantage of the present invention is that it is possible to consider only the real part of a ground fault current when determining whether the ground fault current requires a response.

Another advantage is that it is practical to simultaneously provide ground fault protection to both personnel and equipment.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 9 is a schematic diagram of the power control and sensing system of FIG. 7.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

The present invention accurately measures both the real and imaginary parts of the ground fault current. Although this measurement can be performed using analog or digital techniques, a digital method, as described herein, is simpler and lower cost.

Ideally, rejecting or ignoring the imaginary component $i_5$ of the ground fault current $i_3$ provides superior protection since the real component $i_4$ which causes heating is detected. Furthermore, sensitivity to the real component $i_4$ is such that the 6 milliampere personnel safety current limit can be maintained while providing a 30 milliampere, or higher limit for the reactive component. Thus, simultaneous equipment and personnel protection is both practical and possible.

By assuming sinusoidal steady state conditions, the real component $i_4$ and imaginary component $i_5$ of $i_3$ can be trigonometrically calculated from the magnitude of $i_3$ if the phase angle $\theta$ is known. The equations follow:

$$\mathrm{Re}\{i_3\} = i_3 \cos\theta$$

$$\mathrm{Im}\{i_3\} = i_3 \sin\theta$$

Figure 6:
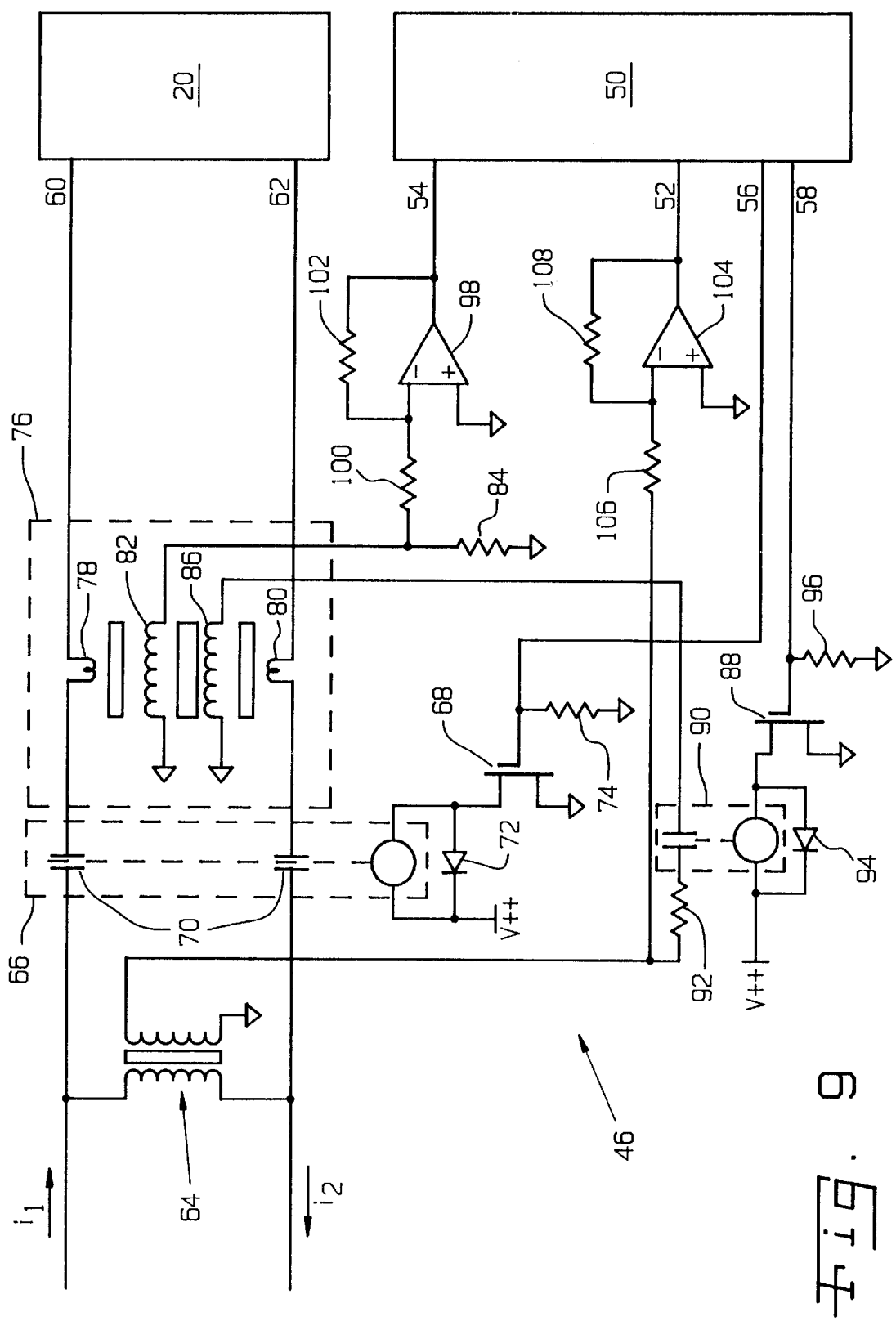
FIG. 6a is a plot of the ground fault current of FIG. 2 versus time.
FIG. 6b is a plot of the voltage across the input wiring of the branch circuit of FIG. 2 versus time.
FIG. 6c is a pulse waveform indicative of the time difference between the ground fault current of FIG. 6a and the branch voltage of FIG. 6b.

The phase angle $\theta$ is determined by measuring the phase shift between the ground fault current $i_3$ (FIG. 6a) and the branch voltage (FIG. 6b) across input wiring 12. This can be accomplished by measuring the time difference between the positive going zero crossing of the ground fault current waveform (FIG. 6a) and the next positive going zero crossing of the branch voltage waveform (FIG. 6b). The phase angle $\theta$ is calculated using the following equation:

$$\theta = 360° \text{ (time difference) frequency}$$

wherein

'$\theta$' is the phase shift in degrees;

'f' is the power line frequency in Hertz; and

'time difference' is the time between zero crossings in seconds.

The time difference is indicated by a width of each individual pulse in a pulse waveform (FIG. 6c).

Using the above procedure eliminates the need for high speed real-time calculation. Only the time difference needs to be measured. This is accomplished with a simple time period measurement that is a built-in function of most microcontrollers. After determining the time difference, the phase shift angle $\theta$ can be easily calculated from the expression show above. The values of $\sin\theta$ and $\cos\theta$ can be determined from a look-up table. Simple multiplication yields the values of $\mathrm{Re}\{i_3\}$ and $\mathrm{Im}\{i_3\}$.

The above-described procedure for calculating the values of $\mathrm{Re}\{i_3\}$ and $\mathrm{Im}\{i_3\}$ is a simple and inexpensive method for obtaining the desired result without the need for high speed arithmetic. For example, these calculations can also be performed real-time using a digital signal processor.

Figure 1:
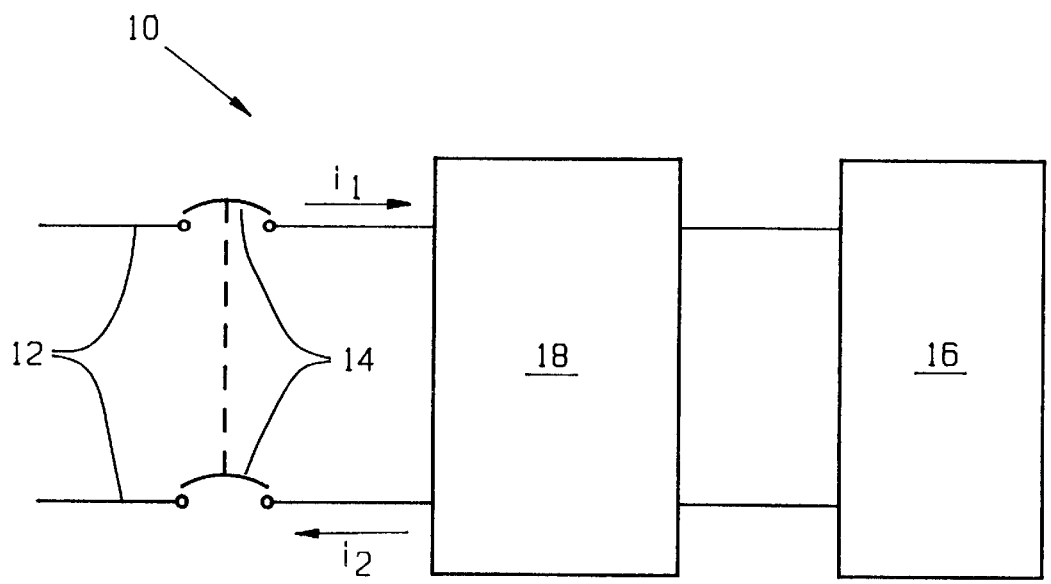
FIG. 1 is a schematic diagram of a known branch circuit with no ground fault current.
Figure 2:
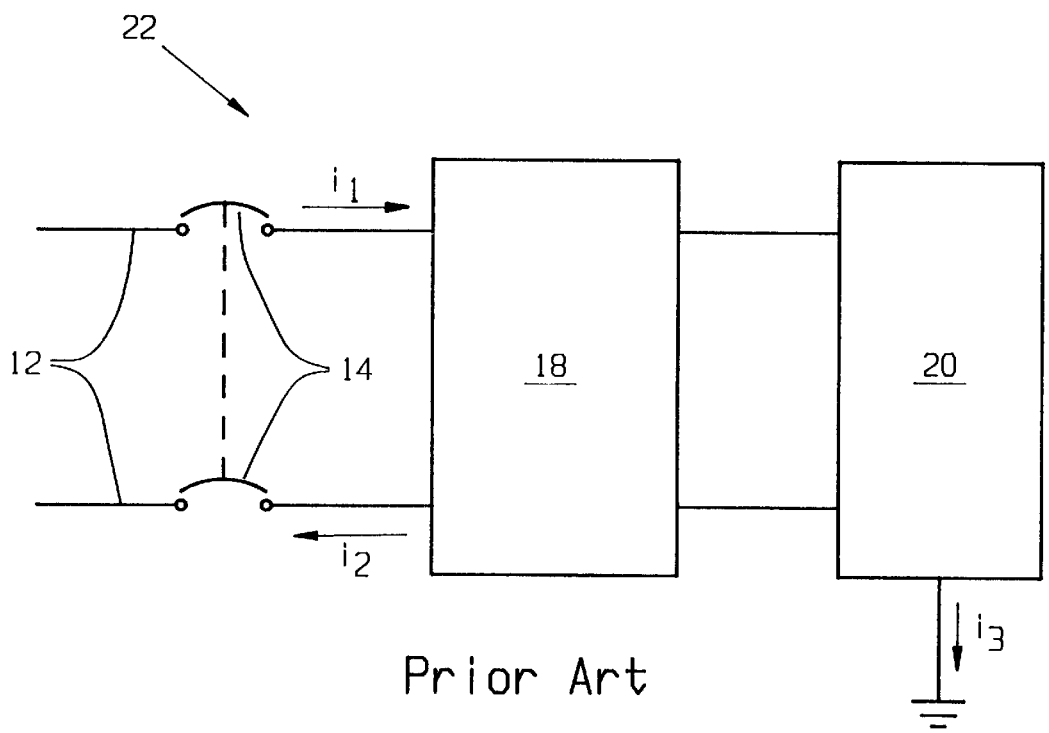
FIG. 2 is a schematic diagram of a known branch circuit with a ground fault current.
Figure 3:
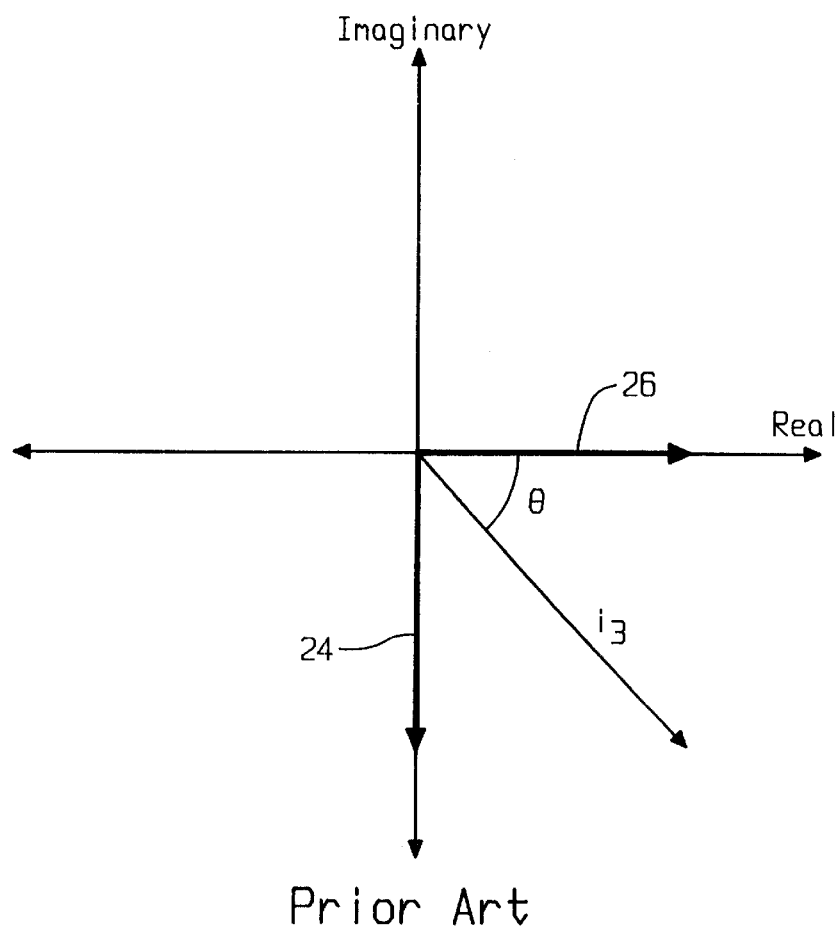
FIG. 3 is a phasor diagram of the ground fault current of FIG. 2.
Figure 4:
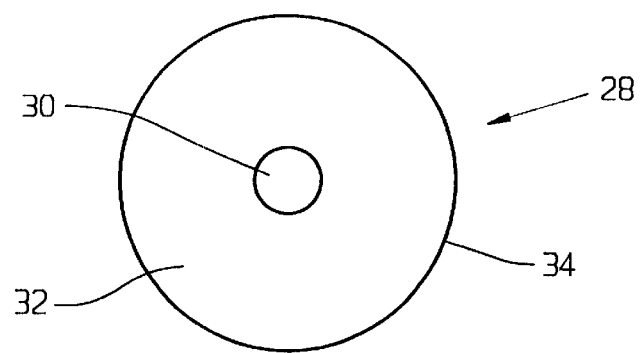
FIG. 4 is a schematic, cross sectional view of a known heating cable.
Figure 5:
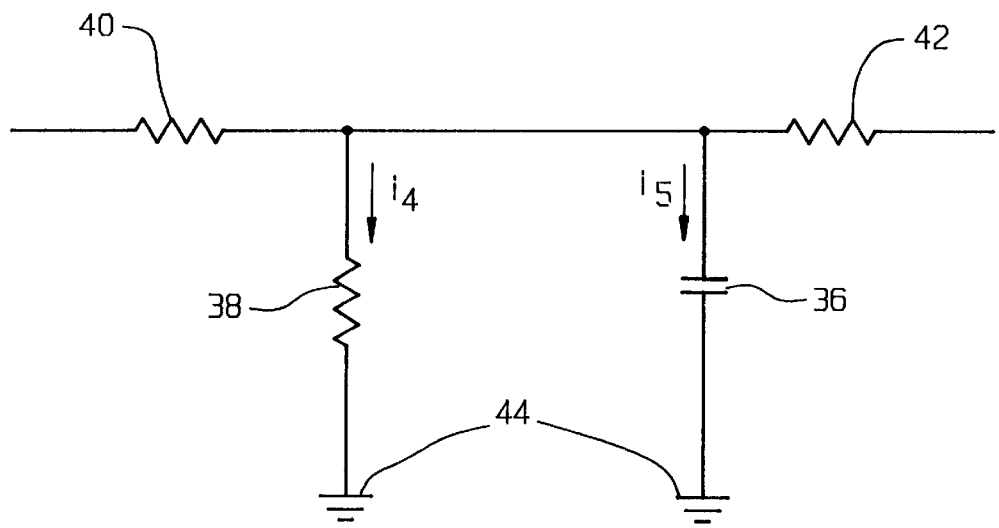
FIG. 5 is a schematic diagram of a simplified equivalent circuit of the heating cable of FIG. 4.
Figure 7:
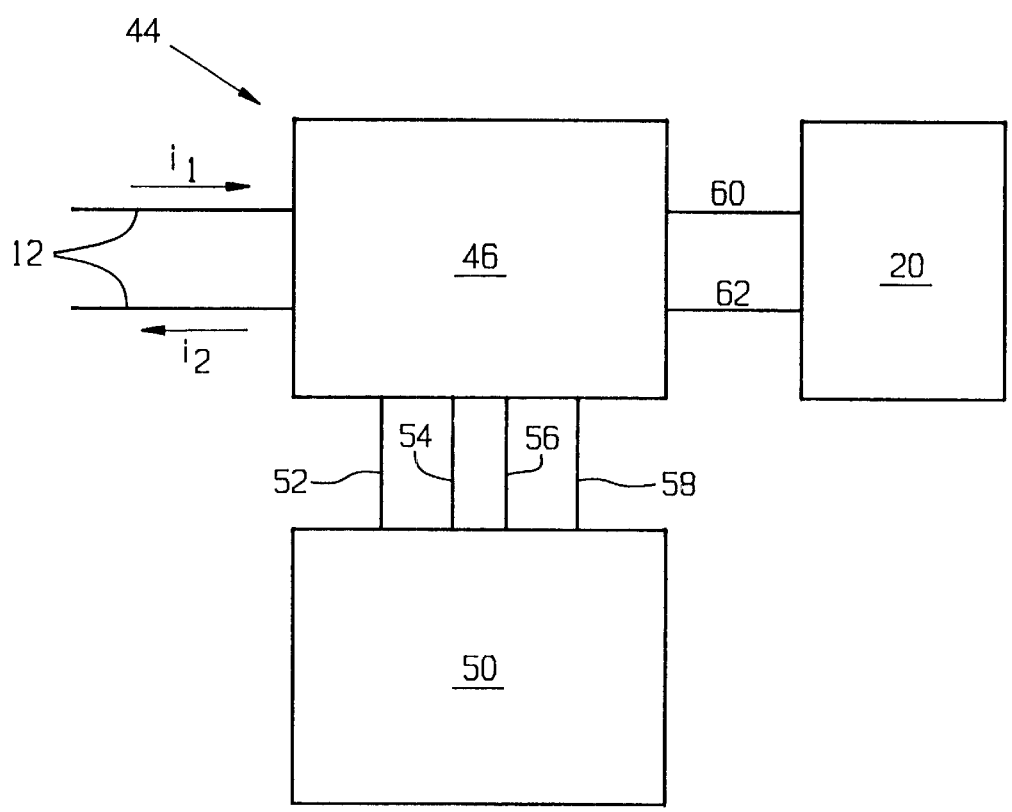
FIG. 7 is a block diagram of one embodiment of a ground fault protector of the present invention.

One embodiment of a ground fault protector 44 (FIG. 7) of the present invention is shown attached to a load 20. A power control and sensing subsystem 46 performs the higher level functions including power control and converting the ground fault current and branch circuit voltage into signal levels required by a microcontroller 48 (FIG. 8) of microprocessor subsystem 50. Microprocessor subsystem 50 performs computational, timing, display and operator interface tasks.

Wires 52, 54, 56 and 58 conduct signals between power control and sensing system 46 and microcontroller subsystem 50. Operating voltage and ground connections have been omitted for clarity.

The branch circuit connections are made through input wiring 12. Load 20 is connected to system 46 through wires 60 and 62.

Power control and sensing subsystem 46 is capable of sensing the ground fault current, functionally checking the operation of ground fault protector 44 and interrupting load current upon command.

A control transformer 64 (FIG. 9) reduces the branch voltage to a convenient value without introducing phase error. Its secondary voltage provides current for self-testing the ground fault protection function and the phase reference used to determine the real and imaginary components of ground fault current $i_3$.

A double pole contactor 66 interrupts current to load 20 during self-test of ground fault protector 44 or in the event the ground fault current $i_3$ exceeds a preset value. Both sides of the branch circuit are broken. This is necessary to interrupt the ground fault current in power distribution systems without a grounded neutral, e.g., 240 volts 3-wire, 208 volts 3-phase and 480 volts 3-phase in the U.S.

Microcontroller 48 placing a logic voltage on input lead 56 to the gate of N-channel metal oxide field effect transistor NMOSFET 68 causes current to flow through the solenoid coil of double pole contactor 66. This pulls-in or closes the contacts 70 of contactor 66, thus applying the branch circuit voltage to load 20. The contactor coil operates from the DC supply voltage V++. A diode 72 protects NMOSFET 68 from a destructive inductive voltage transient when interrupting current to the contactor coil. A pull-down resistor 74 prevents spurious contactor operation if the NMOSFET gate wire 56 is open-circuited, as is often the case during power-on initialization of associated microcontroller 48.

A four-winding current transformer 76 performs a variety of functions. One function is summing the branch circuit currents flowing through single-turn winding number one 78 and single-turn winding number two 80. Winding number three 82 is connected to current shunt resistor 84. This causes a voltage to appear across shunt resistor 84 that is proportional to its value divided by the number of turns of wire forming winding number three 82. Winding number four 86 is an auxiliary winding used for self-test purposes.

Microcontroller 48 placing a logic level voltage on input lead 58 to the gate of NMOSFET 88 causes current to flow through a coil of a relay 90, which causes the relay's contact to close. This causes current supplied by control transformer 64 to flow through a limiting resistor 92 and thence through the self-test winding 86 of the four-winding current transformer 76. This simulates a ground fault current above the threshold value.

The coil of relay 90 is supplied from the V++ voltage. A diode 94 protects NMOSFET 88 from a destructive inductive voltage transient when interrupting current to the relay coil. A pull-down resistor 96 prevents spurious relay operation if the NMOSFET gate wire 58 is open-circuited, as is often the case during power-on initialization of associated microcontroller 48.

An operational amplifier 98 is configured as a non-inverting amplifier. Its voltage gain is determined by the ratio of its feedback resistors 100 and 102. This assumes that the value of resistor 100 is much greater than the value of shunt resistor 84. Thus, the output voltage of the operational amplifier 98 appearing at wire 54 is linearly proportional to the magnitude of the ground fault current.

An operational amplifier 104 is configured as a non-inverting amplifier. Its voltage gain is determined by the ratio of its feedback resistors 106 and 108. The output voltage of control transformer 64 is buffered and reduced in amplitude by the voltage amplifier employing operational amplifier 104. The buffered output appears at wire 52.

Figure 8:
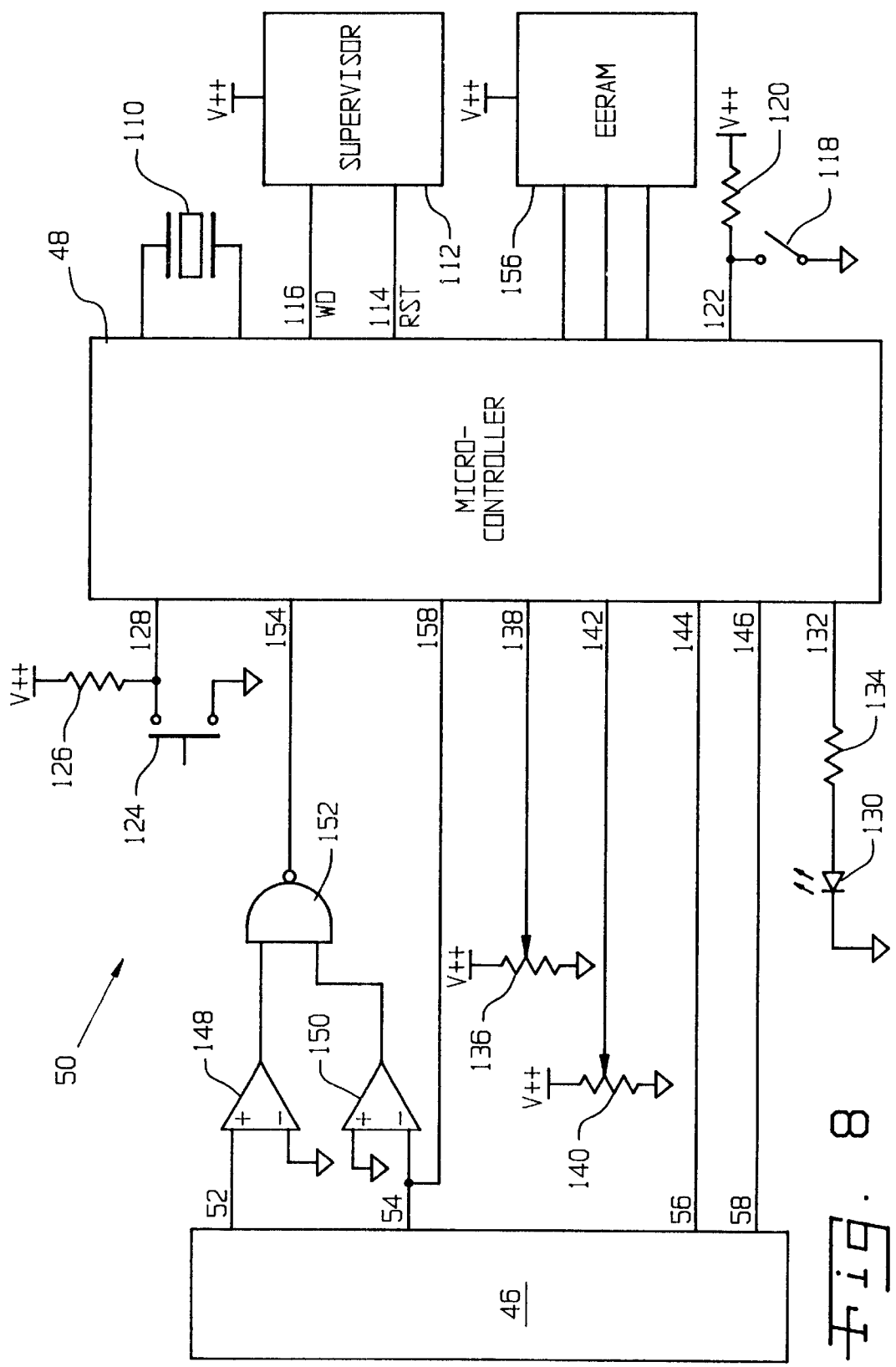
FIG. 8 is a schematic diagram of the microcontroller subsystem of FIG. 7.

FIG. 8 shows the microcontroller 48, along with support and interface elements. Support elements include a crystal resonator 110 whose function is to provide a stable accurate clock frequency for microcontroller 48. This insures the accurate timing functions required by the invention.

A supervisor support element 112 insures predictable start-up of microcontroller 48 upon the application of power. Supervisor 112 also prevents electrical transients from upsetting the operation of microcontroller 48. Supervisor 112 asserts microcontroller restart by holding the microcontroller's RST input 114 high unless the power supply voltage is stable. Supervisor 112 asserts restart input high unless its 'watch dog' input 116 is toggled every 100 milliseconds or so. This prevents microcontroller 48 from latching and thus failing to perform its required functions. When microcontroller 48 periodically emits the 'watch dog' toggle, it insures that it is properly executing its program.

A switch 118 selects the response to a ground fault condition. The default condition is selected with the switch 118 open as is shown. The second response occurs if the switch 118 is closed. Resistor 120 provides a pull-up to V+. This provides a logic level change that is inputted to microcontroller port 122.

A pushbutton switch 124 toggles the TEST/RESET of the ground fault protection function. A resistor 126 performs a pull-up function. Pushing switch 124 provides a logic level change at the microcontroller input port 128.

A light emitting diode (LED) ground fault indicator 130 operates while a microcontroller port 132 is logically high. A resistor 134 sets ground fault indicator 130 to its design value.

A potentiometer 136 creates an adjustable bias voltage at an analog-to-digital converter (ADC) input port 138. This bias sets the ground fault trip current value for the real part of the ground fault current $i_3$.

Another potentiometer 140 creates an adjustable bias voltage at an ADC input port 142. This bias sets the ground fault trip current value for the imaginary (i.e., capacitive) part of the ground fault current $i_3$.

A microcontroller output port 144 provides an output signal for operating two-pole contactor 66. Similarly, a microcontroller output port 146 provides an output signal for operating relay 90.

Comparators 148 and 150 along with the NAND gate 152 generate a pulse proportional to the phase difference between the branch circuit voltage and the ground fault current $i_3$. The pulse (FIG. 6c) is inputted to a microcontroller timer port 154.

Microcontrollers commonly provide a facility for measuring the period of an external waveform. This is accomplished by gating a train of internally generated pulses, derived from the microcontroller's crystal-controlled clock, into an internal register. The external signal controls the gate. For example, the gate could open on the leading edge of the external waveform and close on the trailing edge. The contents of the register, which is proportional to the period of the external waveform, can be transferred to the microcontroller's program counter, or equivalent register.

Either of two ground fault protection responses are provided to a ground fault condition. Switch 118 selects the response. The default response is to maintain power interruption to the load 20 until the resetting of the ground fault condition, which is accomplished by pressing switch 124. Leaving switch 118 in its normally open position selects this response. When selecting this mode, microcontroller 48 must store the information that a ground fault occurred in EERAM 156 or its equivalent (i.e., flash RAM). The U.S. and Canadian NEC require power interruption to the load after operating power is restored to ground fault protector 44 in the event of an interruption.

The second response is to indicate the ground fault condition while the ground fault condition exists. Power to the load 20 is not interrupted. No reset action is required if the condition clears. This response in enabled by closing switch 118 only in certain fire protection applications where the ground fault condition is a secondary consideration to maintaining load power. This is the case for heater controls in wet sprinkler systems.

If no ground fault condition exists, pressing switch 124 automatically verifies proper ground fault protection operation. Verification consists of a sequence of steps. Immediately after switch 124 has been pressed, two-pole contactor 66 is de-energized, if it is energized, thus removing power to load 20. This removes external ground fault current to insure verification accuracy.

Next, relay 90 is energized, thus applying the test current to the current transformer winding four 86. This current simulates a ground fault current above the real threshold value. The ground fault indicator 130 will operate for approximately two seconds. If the ground fault test fails, ground fault indicator 130 will flash continuously and two-pole contactor 66 will remain de-energized as is the case with the default response (i.e., when switch 118 is open).

If switch 118 is closed, thus selecting the warning mode, a verification failure is identified by ground fault indicator 130 continuing to flash. However, normal operation of two-pole contactor 66 will resume.

If the test is successful, relay 90 is de-energized along with ground fault indicator 130. Next, two-pole contactor 66 resumes the state that it was in before switch 124 was pressed. A new test sequence cannot be initiated unless switch 124 has been released and is not pressed for two contiguous seconds.

Potentiometers 136 and 140 set the real and imaginary (i.e., capacitive) ground fault trip current levels, respectively. Currents exceeding these levels cause ground fault protector 44 to operate to remove power from load 20. It is possible to make these calibrated adjustments accessible to maintenance personnel. Normally, potentiometers 136, 140 are used to calibrate ground fault protector 44 during manufacture.

The voltage between potentiometers 136 and 140 and ground is linearly proportional to the wiper position. This makes it possible to calibrate these adjustments. The hardware embodiment herein described operates from a single positive power supply. The AC voltages inputted to the microcontroller A-D input ports 138, 142 are half-wave. This reduces analog signal processing circuit complexity and costs (e.g., elimination of the need for a second negative power supply along with DC level shifting components).

The wiper voltages are encoded by the microcontroller's A-D converter and thereafter stored in specific random access memory (RAM) locations. The microcontroller inputs 138 and 142 are serviced by the internal A-D converter.

Determining the real and imaginary ground fault current values involves executing a sequence of processes. Conceptually, a process can viewed as being similar to a subroutine or subprogram. However, unlike a subroutine, a process can describe a sequence of steps that can execute as a program. The words "subroutine" and "process" are used interchangeably herein.

The first process includes the steps required to determine the magnitude of the ground fault current. The positive peak value of the ground fault current waveform (FIG. 6a) is measured since it is linearly proportional to the magnitude.

As is shown in FIG. 6a, the ground fault current waveform is sinusoidal. Thus, its peak value occurs 90 degrees after zero crossing. This occurs at a point in time that is one-quarter of the period of the sinusoid after the zero crossing. With a 60 Hz power line frequency, the peak occurs approximately $1/240$ second (0.0041667 second) after the zero crossing.

Note that the derivative of the ground fault current waveform (FIG. 6a) with respect to time is zero at the 90 degree point. Thus, the amplitude of the ground fault waveform does not change rapidly with respect to time at the 90 degree point. A plus or minus one degree change at 90 degrees results in less than a minus 0.016% change in the peak value. Further note that one degree of phase shift at 60 Hz is 46.3 microseconds.

Measurement of the peak value of the ground fault current waveform connected to an input 158 is accomplished by triggering the microcontroller's A-D 0.0041667 second after the zero crossing. Microprocessor 48 provides timing capability for this purpose. Depending upon the resonator frequency selected, the delay time can be set with an uncertainty that is less than 40 microseconds. The A-D encodes the value at its input 158 when triggered. The encoding time can be up to 100 microseconds depending upon the resonator frequency. The encoded value is added to the contents of a specific RAM location.

Noise (i.e., uncertainty) in the ground fault current magnitude value could cause spurious ground fault protection operation. Filtering minimizes uncertainty. The ground fault current magnitude is filtered by adding the four most recent ground fault current magnitudes to the specific RAM location cited in the previous paragraph. After each fourth sample, the contents of this RAM location is shifted left twice. In effect, this divides the contents of the ground current magnitude location by four. The resulting value is taken as the ground fault current magnitude for another process.

FIG. 6c shows the pulse the duration of which is proportional to the phase difference between the branch voltage waveform (FIG. 6b) and the ground fault current waveform (FIG. 6a). At a branch supply of 60 Hz, the pulse width is 43.6 microseconds per degree of phase shift. The pulse is applied to the input 154 of microcontroller 48.

Microcontroller 48 provides a facility for measuring the period of a pulse connected to the input port 154. Microcontroller 48 does this by applying a gated periodic pulse train derived from its resonator controlled clock into an internal register that is configured as a counter. The period of the internal pulse train is less than the time interval of one degree of phase shift at the branch circuit frequency. For example, a period of less than 40 microseconds is adequate for 60 Hz since this provides a resolution that is better than one degree. Thus, the pulse train frequency should exceed 25 KHz.

The external pulse (FIG. 6c) connected to the input port 154 gates the pulse train supplied to the counter. Counting begins with the positive leading edge of the pulse and stops upon the trailing edge of the pulse. The resulting number stored in the counting register is linearly proportional to the duration of the external pulse. This number is transferred to a unique RAM location for storage until needed.

The scaled values for the both the sine and cosine functions are stored in a single, common lookup table or array of ninety contiguous locations in program memory 156. Scaling of these values simplifies future calculation. The array index, that is, phase angle, determines the sine or cosine value. The symmetry of these function eliminates the need to store separate values for the sine and cosine functions. That is, the single array of ninety contiguous values is used to determine both sine and cosine values.

Next, the array index is calculated from the counter value stored in a unique RAM location, as was described in the previous paragraph. This requires integer offsets and rotations of the counter value. Individual array indexes are required to select the scaled sine and cosine values which are stored in unique RAM locations.

The scaled imaginary value is determined by multiplying the stored sine and stored ground fault current magnitude values together and the result is stored in a unique RAM location. The scaled real value is determined by multiplying the stored cosine and stored ground fault current magnitude values together and the result is stored in a unique RAM location.

The output of the calibrated real ground fault setting potentiometer 136 is connected to the microcontroller A-D input 138. Microcontroller 48 encodes its value and stores it in a unique RAM location.

The output of the calibrated imaginary ground fault setting potentiometer 140 is connected to the microcontroller A-D input 142. Microcontroller 48 encodes its value and stores it in a unique RAM location.

The scaling described above in determining the sine and cosine of the phase angle assures that the internally stored real and imaginary ground fault current values match the encoded internally stored real setting and imaginary ground fault current calibrations. That is, the settings are accurately calibrated in engineering units of milliamperes.

Either or both of two conditions command a ground fault trip. The first condition is the stored real ground current value equaling or exceeding the stored real setting. The second condition is the stored imaginary ground current value equaling or exceeding the stored imaginary setting value. In the event that either or both these conditions occur, a ground fault condition exists and a trip is declared.

As discussed above, ground fault protector 44 has a choice of two responses to a ground fault condition. Switch 118 selects the response.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of controlling a load in response to a ground fault condition, said method comprising the steps of:
   measuring a ground fault alternating current flowing from the load;
   ascertaining a real part and an imaginary part of the ground fault alternating current, including the step of determining a phase angle of the ground fault alternating current relative to a branch current entering the load, said determining step comprising the sub-steps of:
   ascertaining a period of at least one of the ground fault alternating current, the branch current and a branch voltage;
   measuring a time period between a zero-crossing of the ground fault alternating current and a zero-crossing of the branch current; and
   dividing the time period by the period of at least one of the ground fault alternating current and the branch current; and
   at least one of removing electrical power from the load and indicating the ground fault condition to a user if at least one of:
   a magnitude of the real part exceeds a first predetermined threshold; and
   a magnitude of the imaginary part exceeds a second predetermined threshold.

2. The method of claim 1, wherein the first predetermined threshold is such that both personnel and equipment are simultaneously protected.

3. The method of claim 1, wherein said ascertaining step comprises:
   measuring a magnitude of the ground fault alternating current; and
   at least one of:
   multiplying the magnitude of the ground fault alternating current by a cosine of the phase angle; and
   multiplying the magnitude of the ground fault alternating current by a sine of the phase angle.

4. The method of claim 3, wherein said step of measuring a magnitude of the ground fault alternating current is performed at a time corresponding to a peak of the ground fault alternating current.

5. The method of claim 4, wherein the time corresponding to the peak is approximately one-quarter of the period of at least one of the ground fault alternating current, the branch current and the branch voltage after the zero-crossing of the ground fault alternating current.

6. The method of claim 5, wherein said first predetermined threshold is approximately 6 milliamperes and said second predetermined threshold is approximately 30 milliamperes.

7. The method of claim 1, wherein said cosine of the phase angle and said sine of the phase angle are stored in a common array.

8. The method of claim 1, wherein said measuring and ascertaining steps are performed under sinusoidal steady state conditions.

9. The method of claim 1, comprising the further step of at least one of calibrating and adjusting at least one of said first predetermined threshold and said second predetermined threshold.

10. The method of claim 9, wherein said step of at least one of calibrating and adjusting is performed using a single positive power supply.

11. A ground fault circuit interrupter apparatus, said apparatus comprising:
    a ground fault current detector configured for measuring a ground fault current from a load and producing at least one ground fault signal indicative thereof; and
    an automatic control circuit connected to said ground fault current detector, said control circuit being configured for:
    receiving said at least one ground fault signal;
    ascertaining a real part and an imaginary part of the ground fault current dependent upon said at least one ground fault signal; and
    at least one of removing electrical power from the load and indicating a ground fault condition if at least one of:
    a magnitude of the real part exceeds a first predetermined threshold; and a magnitude of the imaginary part exceeds a second predetermined threshold;
    wherein said at least one ground fault signal includes a pulse signal indicative of a phase angle of the ground fault current relative to a branch current entering the load, said pulse signal includes a plurality of pulses, a duration of each said pulse corresponding to a time period between a respective zero-crossing of the ground fault current and a respective zero-crossing of one of the branch current and a branch voltage.

12. The apparatus of claim 11, wherein said ground fault current detector includes a current transformer connected to the load.

13. The apparatus of claim 12, wherein said current transformer has an output, said ground fault current detector including a non-inverting amplifier connected to said output of said current transformer.

14. The apparatus of claim 11, wherein said automatic control circuit includes a switch having a first position and a second position, said control circuit being configured for removing electrical power from the load when said switch is in said first position, said control circuit being configured for indicating a ground fault condition to a user when said switch is in said second position.

15. The apparatus of claim 11, wherein said automatic control circuit includes a contactor configured for removing electrical power from the load.

16. The apparatus of claim 11, wherein the load comprises a shielded heater wire.

* * * * *